(12) United States Patent
Liu et al.

(10) Patent No.: US 10,545,594 B2
(45) Date of Patent: Jan. 28, 2020

(54) ARRAY SUBSTRATE, FABRICATION METHOD AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Chong Liu, Beijing (CN); Haisheng Zhao, Beijing (CN); Zhilian Xiao, Beijing (CN); Hongxi Xiao, Beijing (CN); Wei Wang, Beijing (CN); Xiaoguang Pei, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 66 days.

(21) Appl. No.: 15/745,000

(22) PCT Filed: Aug. 15, 2017

(86) PCT No.: PCT/CN2017/097471
§ 371 (c)(1),
(2) Date: Jan. 15, 2018

(87) PCT Pub. No.: WO2018/157563
PCT Pub. Date: Sep. 7, 2018

(65) Prior Publication Data
US 2019/0012023 A1   Jan. 10, 2019

(30) Foreign Application Priority Data

Mar. 3, 2017 (CN) .......................... 2017 1 0123374

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *G06F 3/047* (2013.01);
(Continued)

(58) Field of Classification Search
CPC ........ G06F 3/0412; G06F 3/044; G06F 3/047; H01L 23/3171; H01L 27/127; H01L 27/124
See application file for complete search history.

(56) References Cited

U.S. PATENT DOCUMENTS

2007/0285594 A1    12/2007  Kang et al.
2012/0024816 A1*    2/2012  Huang .................... G06F 3/044
                                                                216/13
(Continued)

FOREIGN PATENT DOCUMENTS

JP         2012155198 A        8/2012

OTHER PUBLICATIONS

International Search Report & Written Opinion dated Nov. 1, 2017, regarding PCT/CN2017/097471.

*Primary Examiner* — Alexander Eisen
*Assistant Examiner* — Cory A Almeida
(74) *Attorney, Agent, or Firm* — Intellectual Valley Law, P.C.

(57) ABSTRACT

An array substrate includes a substrate, a first signal line and a second signal line on the substrate, an insulating layer covering the first signal line and the second signal line, and a groove penetrating through the insulating layer. The first signal line and the second signal line are arranged in a same
(Continued)

layer and separated from each other. The groove is between the first signal line and the second signal line.

16 Claims, 5 Drawing Sheets

(51) Int. Cl.
    *G06F 3/047*     (2006.01)
    *H01L 23/31*     (2006.01)
    *H01L 27/12*     (2006.01)

(52) U.S. Cl.
    CPC ........ *H01L 23/3171* (2013.01); *H01L 27/124* (2013.01); *H01L 27/127* (2013.01); *G06F 2203/04103* (2013.01)

(56) References Cited

U.S. PATENT DOCUMENTS

| | | |
|---|---|---|
| 2014/0361786 A1 | 12/2014 | Yao et al. |
| 2015/0301645 A1 | 10/2015 | Mu et al. |
| 2015/0309634 A1* | 10/2015 | Lee ........................ G06F 3/0412 345/173 |
| 2016/0266677 A1 | 9/2016 | Liu et al. |

\* cited by examiner

ARRAY SUBSTRATE, FABRICATION METHOD AND DISPLAY DEVICE

CROSS-REFERENCE TO RELATED APPLICATION

This PCT patent application is a national stage application under 35 U.S.C. § 371 of International Application No. PCT/CN2017/097471, filed Aug. 15, 2017, which claims priority to Chinese Patent Application No. 201710123374.6, filed on Mar. 3, 2017, the entire contents of which are incorporated herein by reference.

TECHNICAL FIELD

The present disclosure generally relates to display technologies and, more particularly, to an array substrate, a fabrication method thereof, and a display device containing the array substrate.

BACKGROUND

A touch display panel, such as an embedded touch display panel of a self-capacitance structure type, may include a plurality of block-shaped touch electrodes. Each touch electrode is coupled to a driving circuit through a touch signal line. The driving circuit receives a signal change through each touch signal line and the coordinate position of each touch electrode to determine the touch position.

Generally, in the existing technology, a parallel signal line is coupled to a touch signal line in parallel in an array substrate of a touch display panel. However, in a patterning process, a conductive residue may also be generated between the parallel signal line and a data line due to the influence of dust or other foreign matter, causing sub-pixels in the touch display panel not to display properly.

SUMMARY

In one aspect, the present disclosure provides an array substrate including a substrate, a first signal line and a second signal line on the substrate, an insulating layer covering the first signal line and the second signal line, and a groove penetrating through the insulating layer. The first signal line and the second signal line are arranged in a same layer and separated from each other. The groove is between the first signal line and the second signal line.

Another aspect of the present disclosure provides a fabrication method for an array substrate including providing a substrate and forming a pattern including a first signal line and a second signal line on the substrate. The first signal line and the second signal line are arranged in a same layer and separated from each other. The method further includes forming all insulating layer covering the first signal line and the second signal line, and forming a groove penetrating through the insulating layer and between the first signal line and the second signal line.

BRIEF DESCRIPTION OF THE FIGURES

The following drawings are merely examples for illustrative purposes according to various disclosed embodiments and are not intended to limit the scope of the present disclosure.

Figure 1:
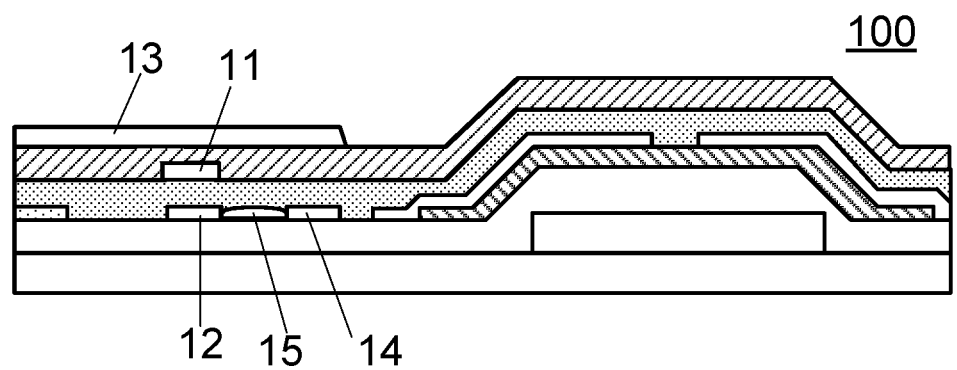
FIG. 1 illustrates a schematic view of an array substrate in the existing technology.

Reference numerals used in the drawings include: 11, touch signal line; 12, parallel signal line; 13, touch electrode; 14, data line; 15, conductive residue; 20, substrate; 21, first signal line; 22, second signal line; 23, third signal line; 24, insulating layer; 241, groove; 251, gate electrode; 252, gate insulating layer; 253, active layer; 254, source electrode: 255, drain electrode; 26, touch electrode; 27, passivation laver: 28, pixel electrode; 100, array substrate; 200, array substrate; 400, fabrication method; 500, fabrication method; 600, display device.

DETAILED DESCRIPTION

Exemplary embodiments of the disclosure will now be described in more detail with reference to the drawings. It is to be noted that, the following descriptions of some embodiments are presented herein for purposes of illustration and description only, and are not intended to be exhaustive or to limit the scope of the present invention.

FIG. 1 illustrates a schematic view of an array substrate 100 in the existing technology. In order to improve the accuracy of determining the touch position, a parallel signal line 12 and a touch signal line 11 may generally be coupled in parallel, thereby reducing the connection resistance between a driving circuit and the touch electrode 13, i.e. the total resistance of the touch signal line 11 and the parallel signal line 12 in parallel. The parallel signal line 12 and the touch signal line 11 may be coupled in parallel in the non-display region. FIG. 1, however, illustrates a sectional view of the display region and thus the connection between the parallel signal line 12 and the touch signal line 11 is not shown in FIG. 1. In order to reduce the number of process steps, the parallel signal line 12 and the data line 14 may be fabricated by a same patterning process. When the data line 14 and the parallel signal line 12 are formed in the patterning process, a conductive residue 15 may be generated between the data line 14 and the parallel signal line 12 due to the influence of dust or other foreign matter. As a result, a short circuit between the data line 14 and the parallel signal line 12 may occur.

The touch electrode 13 may function as a common electrode during a display phase. That is, the parallel signal line 12 may be loaded with a common voltage signal during the display phase. Accordingly, when the data line 14 and the parallel signal line 12 are short-circuited, the voltage on the data line 14 may be pulled down to the common voltage on the parallel signal line 12. Thus, the data line 14 may fail to provide the desired data voltage for sub-pixel during the display phase, further causing the sub-pixels not to display properly, resulting in display defects.

Figure 2:
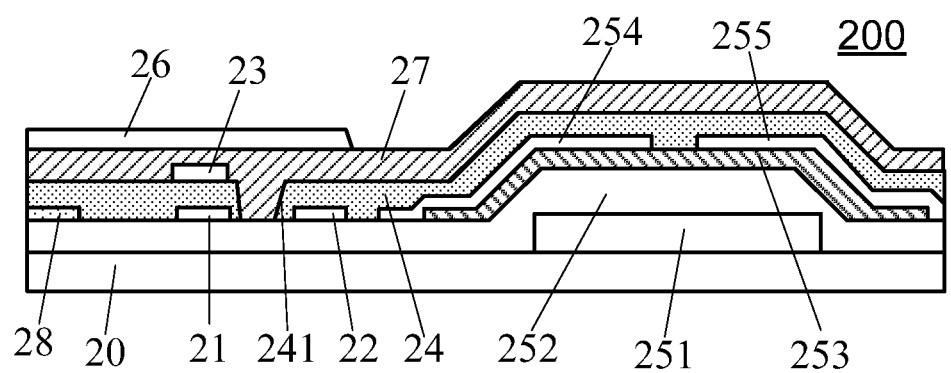
FIG. 2 illustrates a schematic view of an exemplary array substrate according to various disclosed embodiments of the present disclosure.

FIG. 2 illustrates a schematic view of an exemplary array substrate 200 according to various disclosed embodiments of the present disclosure. As shown in FIG. 2, the array substrate 200 includes a substrate 20, and a first signal line 21, a second signal line 22, and an insulating layer 24 disposed above the substrate 20. The first signal line 21 may be arranged in the same layer as the second signal line 22. That is, a layer where the first signal line 21 is located may coincide with a layer where the second signal line 22 is located. The first signal line 21 is separated from the second signal line 22. The insulating layer 24 covers the first signal line 21 and the second signal line 22. A groove 241 is formed in the insulating layer 24 and penetrates the insulating layer 24. The position of the groove 241 may correspond to a spacing region between the first signal line 21 and the second signal line 22. That is, the groove 241 may be between the first signal line 21 and the second signal line 22. The groove 241 may extend to the bottom surface of the layer in which the first signal line 21 and the second signal line 22 are located, thereby separating the first signal line 21 and the second signal line 22. Accordingly, the first signal line 21 and the second signal line 22 can be electrically insulated from each other. In this disclosure, the layer in which the first signal line 21 and the second signal line 22 is also referred to as a signal line layer.

The first signal line 21 and the second signal line 22 may be disposed in the same layer. Thus, the first signal line 21 and the second signal line 22 may be formed by a same patterning process. In some embodiments, the patterning process may include: forming a metal layer and a photoresist layer; exposing and developing the photoresist layer to retain photoresist in a first region and a second region and to remove photoresist in other regions; etching the metal layer to remove metal not covered by the photoresist, thus to form the first signal line 21 in the first region and the second signal line 22 in the second region; and removing the remaining photoresist. In the production process, impurities such as dust or the like may attach on the metal layer or in the photoresist in the area between the first region and the second region, causing photoresist residue at the position of the dust. Accordingly, the corresponding metal portion may not be completely etched away during the etching of the metal layer. Thus, a metal residue may be generated between the first signal line 21 and the second signal line 22 (such as the conductive residue 15 in FIG. 1), thereby causing a short circuit between the first signal line 21 and the second signal line 22.

In the present disclosure, the groove 241 is disposed in the insulating layer 24 and penetrates the insulating layer 24. The groove 241 is disposed in the spacing region between the first region and the second region, and extends to the bottom surface of the layer in which the first signal line 21 and the second signal line 22 are located. In the production process, the groove 241 can be arranged at the position corresponding to the conductive residue that is formed by impurities such as dust, and the conductive residue may be exposed through the groove 241 (dust and other impurities may have already been removed when removing the photoresist). The conductive residue in the groove 241 can then be etched away, or the conductive residue in the groove 241 can be etched together when the other signal lines are subsequently formed. The adoption of the groove 241 can ensure the electrical insulation between the first signal line 21 and the second signal line 22. Accordingly, a short circuit between the first signal line 21 and the second signal line 22 can be suppressed, and the qualify of the array substrate can be improved.

As shown in FIG. 2, the array substrate 200 may thither include a thin film transistor and a pixel electrode 28 disposed over the substrate 20, and other appropriate structures. In some embodiments, as shown in FIG. 2, the thin film transistor includes a gate electrode 251, a gate insulating layer 252, and an active layer 253. The gate insulating layer 252 is disposed between the gate electrode 251 and the active layer 253. In some embodiments, the gate insulating layer 252 may cover the entire substrate 20. The pixel electrode 28 and the second signal line 22 may be disposed over the gate insulating layer 252. In these embodiments, the bottom surface of the layer in which the first signal line 21 and the second signal line 22 are located corresponds to an upper surface of the gate insulating layer 252. In some other embodiments, the gate insulating layer 252 may not completely cover the substrate 20, and may cover only the gate electrode 251. Further, the first signal line 21 and the second signal line 22 may be disposed directly on the upper surface of the substrate 20. In these embodiments, the bottom surface of the layer in which the signal line 21 and the second signal line 22 are located corresponds to the upper surface of the substrate 20.

Further, as shown in FIG. 2, the array substrate 200 further includes a third signal line 23 disposed over the insulating layer 24. The position of the third signal line 23 may correspond to the position of the first signal line 21. That is, an orthogonal projection of the third signal line 23 on the substrate may at least partially overlap with an orthogonal projection of the first signal line 21 on the substrate. The third signal line 23 can be formed by forming a conductive material layer and then patterning the conductive material layer in a patterning process. When the conductive material layer is etched in the patterning process to form the third signal line 23, the portions of the conductive material layer in regions other than that corresponding to the third signal line 23, including the portion corresponding the spacing region between the first region and the second region need to be etched. Because the position of the third signal line 23 corresponds to the position of the first signal line 21, the conductive residue, which is outside the position of the first signal line 21, can also be etched away together. Thus, the conductive residue can be removed without additional steps. As such, the short circuit between the first signal line 21 and the second signal line 22 can be suppressed.

In the present disclosure, the quantity, shape and size of the grooves 241 can be chosen according to various application scenarios. In some embodiments, for example, a plurality of cylindrical-column- or square-column-shaped wows can be arranged along the length direction of the first signal line 21. Further, a projection of the groove 241 on the substrate 20 may be strip shaped. An extending direction of the strip may be the same or approximately the same as an extending direction of the spacing region between the first signal line 21 and the second signal line 22. In some embodiments, a length of the strip may be the same or approximately the same as a length of the spacing region between the first signal line 21 and the second signal line 22. A width of the strip may be arbitrary or be chosen as needed. As such, after the first signal line 21 and the second signal line 22 are formed by patterning, if a conductive residue coupling the first signal line 21 to the second signal line 22 exists at a position in the spacing region between the first signal line 21 and the second signal line 22, the groove 241 in the insulating layer 24 may expose at least a portion of the conductive residue. Thus, the exposed conductive residue can be removed when the third signal line 23 is formed by the subsequent etching. The electrical insulation between the first signal line 21 and the second signal line 22 can be ensured, without the need to detect the position of the conductive residue.

In some embodiments, the first signal line 21 and the second signal line 22 may be parallel to each other. In these embodiments, the groove 241 may also be parallel to the first signal line 21 and the second signal line 22.

The array substrate consistent with embodiments of the disclosure can be used in a touch display device. In some embodiments, as shown in FIG. 2, the array substrate 200 thither includes a touch electrode 26. The third signal line 23 may be a touch signal lune coupled to the touch electrode 26, and the second signal line 22 may be a data line. The third signal line 23 and the first signal line 21 may be coupled in parallel. The third signal line 23 may also be coupled to a driving circuit (not shown), such that the driving circuit may determine a touch position according to a signal on the touch electrode 26. The first signal line 21 and the third signal line 23 may be coupled in parallel, such that a connection resistance between the touch electrode 26 and the driving circuit may be reduced, thereby improving the accuracy of the touch detection.

In some embodiments, as shown in FIG. 2, the array substrate 200 further includes a passivation layer 27 disposed above the third signal line 23. The touch electrode 26 is disposed over the passivation layer 27 and coupled to the third signal line 23 through at least one first via hole (not shown) penetrating through the passivation layer 27. At least two connectors, e.g., a first connector and a second connector, may be disposed over the passivation layer 27 and in the same layer as the touch electrode 26. A first end of the first connector may be coupled to a fast end of the third signal line 23 through at least one of a plurality of second via holes penetrating through the passivation layer 27. A second end of the first connector may be coupled to a first end of the first signal line 21 through at least one of a plurality of third via holes penetrating through the passivation layer 27 and the insulating layer 24. A first end of the second connector may be coupled to a second end of the third signal line 23 through at least another one of the plurality of second via holes penetrating through the passivation layer 27. The second end of the second connector may be coupled to a second end of the first signal line 21 through at least another one of the plurality of third via holes penetrating through the passivation layer 27 and the insulating layer 24.

In some embodiments, the first via hole, the second via holes, and the third via holes are disposed in the non-display region. That is, the connection position of the touch electrode 26 and the third signal line 23, the connection position of the third signal line 23 and the first signal line 21 are in the non-display region. As such, because FIG. 2 illustrates a sectional view of the display region of the array substrate 200, the via holes described above are not shown in FIG. 2.

Figure 3:
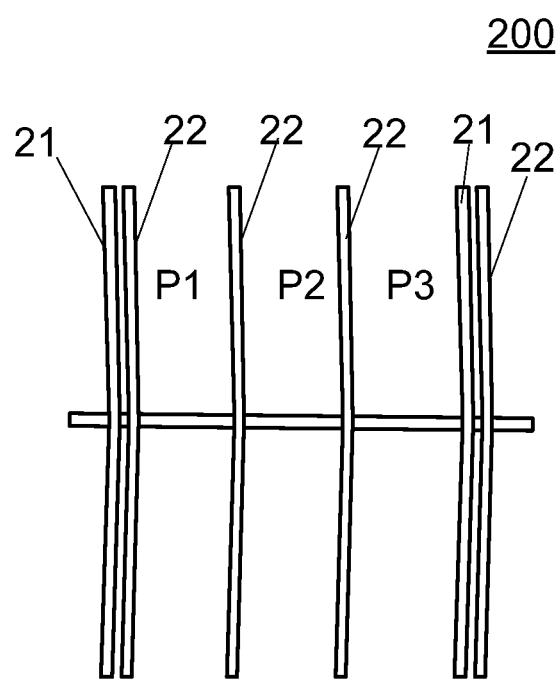
FIG. 3 is a plan view illustrating an exemplary distribution of first signal lines and second signal lines in the exemplary array substrate in FIG. 2 according to various disclosed embodiments of the present disclosure.

In some embodiments, the array substrate consistent with embodiments of the disclosure can include a plurality of first signal lines 21 and a plurality of second signal lines 22, and the number of the second signal lines 22 and the number of the first signal lines 21 may be different. FIG. 3 is a plan view illustrating a distribution of the first signal lines 21 and the second signal lines 22 in the array substrate 200 according to various disclosed embodiments of the present disclosure. As shown in FIG. 3, the array substrate 200 may be divided into a plurality of pixel regions arranged in a plurality of rows and a plurality of columns. Each pixel region may include a plurality of sub-pixel regions arranged in the row direction (such as P1, P2, and P3 in FIG. 3). In this disclosure, a column of pixel regions is also referred to as a pixel region column, and may correspond to one of the first signal lines 21. Further, a column of sub-pixel regions is also referred to as a sub-pixel region column, and may correspond to one of the second signal line 22.

A short circuit may occur more easily between a first signal line 21 and a second signal line 22 closer to the first signal line 21 than between the first signal line 21 and a second signal line 22 farther away from the first signal line 21. Thus, when the groove 241 is formed in the insulating layer 24, the groove 241 may be formed only in the corresponding region between a first signal line 21 and a second signal line 22 between two adjacent pixel regions. That is, groove 241 may not need to be formed between a first signal line 21 and a second signal line 22 that are separated from each other by at least one sub-pixel region.

The touch electrode 26 may be used as a touch electrode in the touch phase and used as a common electrode in the display phase. In the present disclosure, a short circuit between the first signal line 21 and the second signal line 22 can be suppressed. Thus, in a display device including the disclosed array substrate, when a touch occurs in the display phase, the common signal on the touch electrode 26 may not influence the second signal line 22, thereby reducing display defects as compared to the existing technology.

Figure 4:
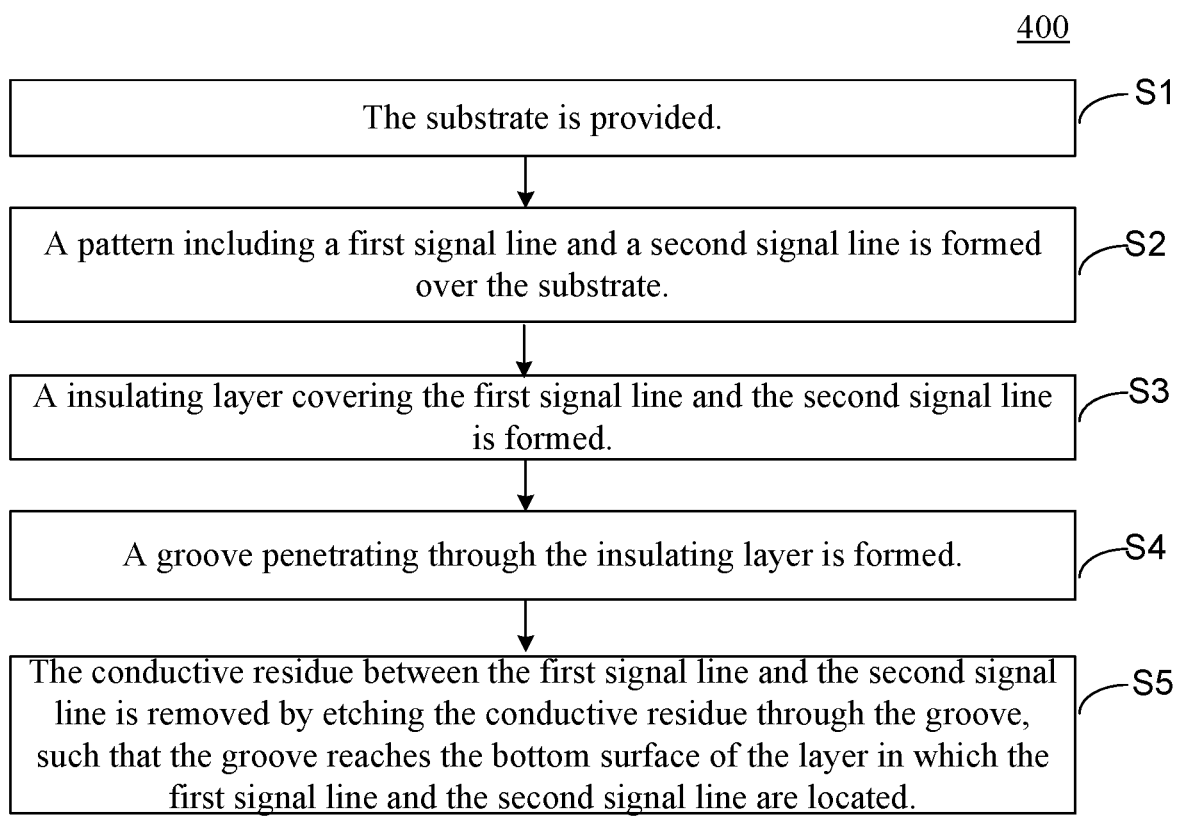
FIG. 4 illustrates a flow chart of an exemplary fabrication method for an exemplary array substrate according to various disclosed embodiments of the present disclosure.

The present disclosure also provides a method of fabricating an array substrate. FIG. 4 illustrates a flow chart of an exemplary fabrication method 400 for an exemplary array substrate according to various disclosed embodiments of the present disclosure. The exemplary fabrication method 400 will be described in more detail with reference to FIG. 2 and FIG. 4.

At S1, the substrate 20 is provided.

At S2, a pattern including the first signal line 21 and the second signal line 22 is formed over the substrate 20. The first signal line 21 and the second signal line 22 are disposed in the same layer and separated from each other.

At S3, the insulating layer 24 covering the first signal line 21 and the second signal line 22 is formed.

At S4, the groove 241 penetrating through the insulating layer 24 is formed. The position of the groove 241 corresponds to the spacing region between the first signal line 21 and the second signal line 22. That is, the groove 241 may be between the first signal line 21 and the second signal line 22.

At S5, the conductive residue between the first signal line 21 and the second signal line 22 is removed by etching the conductive residue through the groove 241, such that the groove 241 reaches the bottom surface of the layer in which the first signal line 21 and the second signal line 22 are located.

According to the method consistent with the disclosure, even if the patterning process for forming the first signal line 21 and the second signal line 22 does not completely remove the conductive material between the first signal line 21 and the second signal line 22, the conductive residue can be exposed through the groove 241 that penetrates through the insulating layer 24 at the position of the conductive residue (the dust and other impurities may have been removed together with the photoresist). Thus, the conductive residue in the groove 241 can be removed by the etching in S5, thereby ensuring that the first signal line 21 and the second signal line 22 are electrically insulated. Accordingly, a short circuit between the first signal line 21 and the second signal line 22 can be prevented thereby improving the quality of the array substrate.

In some embodiments, the etching of the conductive residue through the groove 241 may include an etching of the conductive residue alone. In some other embodiments, the conductive residues may be etched together when other signal lines are being formed, to ensure the electrical insulation between the first signal line 21 and the second signal line 22 regardless of whether the conductive residue exists or not.

Figure 5:
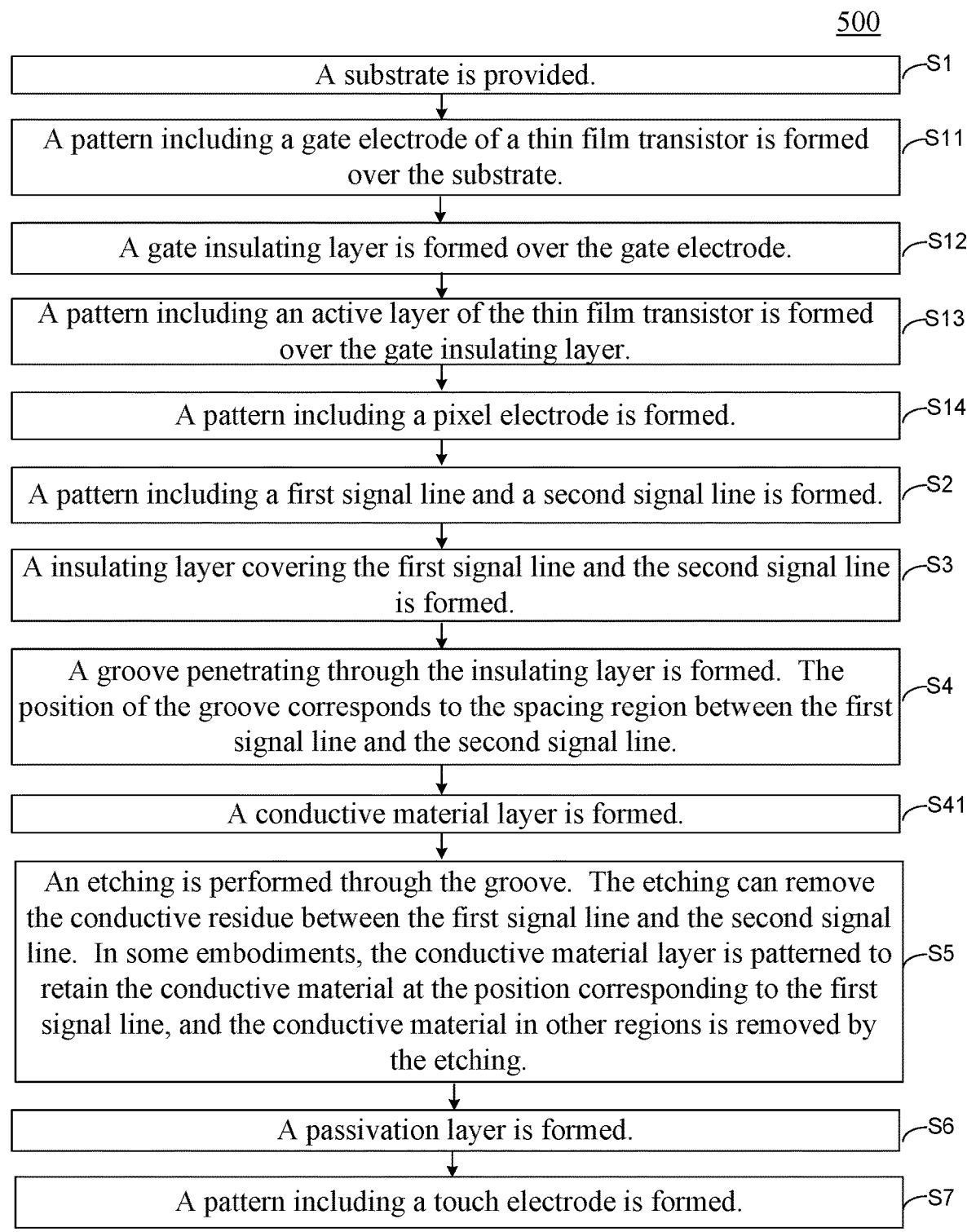
FIG. 5 illustrates another flow chart of an exemplary fabrication method for an exemplary array substrate according to various disclosed embodiments of the present disclosure.

FIG. 5 illustrates another flow chart of an exemplary fabrication method 500 for an exemplary array substrate according to various disclosed embodiments of the present disclosure. The exemplary fabrication method 500 will be described in detail with reference to FIG. 2 and FIG. 5.

At S1, the substrate 20 is provided.

At S11, a pattern including the gate electrode 251 of a thin film transistor is formed over the substrate 20.

At S12, the gate insulating layer 252 is formed over the gate electrode 251.

At S13, a pattern including the active layer 253 of the thin film transistor is formed over the gate insulating layer 252.

At S14, a pattern including the pixel electrode 28 is formed.

At S2, a pattern including the first signal line 21 and the second signal line 22 is formed. In some embodiments, a pattern including the first signal line 21, the second signal line 22, a source electrode 254 of the thin film transistor, and a drain electrode 255 of the thin film transistor is formed over the gate insulating layer 252. The fast signal line 21 and the second signal line 22 may be disposed in a same layer and separated from each other. The second signal line 22 may be a data line. The first signal line 21 and the second signal line 22 may be parallel to each other.

At S3, the insulating layer 24 covering the first signal line 21 and the second signal line 22 is formed.

At S4, the groove 241 penetrating through the insulating layer 24 is formed. The position of the groove 241 corresponds to the spacing region between the first signal line 21 and the second signal line 22. In some embodiments, the projection of the groove 241 on the substrate 20 may be strip shaped, the extending direction of the strip may be the same as or approximately the same as the extending direction of the spacing region between the first signal line 21 and the second signal line 22, and the length of the strip may be the same as or approximately the same as the length of the spacing region between the first signal line 21 and the second signal line 22.

At S41, a conductive material layer is formed. In some embodiments, the conductive material layer may be a metal material layer.

At S5, an etching is performed through the groove 241. The etching can remove the conductive residue between the first signal line 21 and the second signal line 22. In some embodiments, the conductive material layer is patterned to retain the conductive material at the position corresponding to the first signal line 21, and the conductive material in other regions is removed by the etching. The conductive material at the position corresponding to the first signal line 21 may be the conductive material in a portion of the conductive material layer having an orthogonal projection on the substrate which at least partially overlaps with an orthogonal projection of the first signal line 21 on the substrate. Accordingly, the third signal line 23 corresponding to the first signal line 21 is formed. An orthogonal projection of the third signal line 23 on the substrate may at least partially overlap with the orthogonal projection of the first signal line 21 on the substrate. This etching also removes the conductive residue in the groove 241 for ensuring electrical insulation between the first signal line 21 and the second signal line 22 and causes the groove 241 to reach the bottom surface of the layer in which the first signal line 21 and the second signal line 22 are located. As a result, the area at the bottom surface of the layer in which the first signal line 21 and the second signal line 22 are located that corresponds to the groove 241 is exposed. In some embodiments, the bottom surface of the layer in which the first signal line 21 and the second signal line 22 are located may be the upper surface of the gate insulating layer 252.

The material of the conductive material layer for forming the third signal line may be the same as the material forming the first signal line 21 and the second signal line 22. When the conductive residue is present between the first signal line 21 and the second signal line 22, because the groove 241 in the insulating layer 24 may penetrate through the insulating layer 24, at least a portion of the conductive residue may be exposed by the groove 241. Accordingly, the conductive material layer formed at S41 may cover the exposed conductive residue. When the conductive material layer is etched at S5, the conductive material layer at the position of the groove 241 is etched away and the conductive residue between the first signal line 21 and the second signal line 22 is also etched away. Accordingly, the short circuit between the first signal line 21 and the second signal line 22 may be suppressed without an additional step.

At S6, the passivation layer 27 is formed.

At S7, a pattern including the touch electrode 26 is formed.

The third signal line 23 formed at S5 may be a touch signal line coupled to the touch electrode 26. The first signal line 21 and the third signal line 23 may be coupled in parallel. In some embodiments, in order to couple the touch electrode 26 to the third signal line 23, and to couple the third signal line 23 and the first signal line 21 in parallel, at least one first via hole penetrating through the passivation layer 27, and second via holes penetrating through the passivation layer 27 and third via holes penetrating through the passivation layer 27 and the insulating layer 24 may be formed after forming the passivation layer 27 and before forming the pattern including the touch electrode 26. The second via holes and the third via holes may be disposed at both ends of the first signal line 21.

The pattern including the touch electrode 26 that is formed at S7 can also include two connectors, i.e., a first connector and a second connector. The two connectors may correspond to two ends of the third signal line 23, respectively. The first end of the first connector may be coupled to the first end of the third signal line 23 through at least one of the second via holes penetrating through the passivation layer 27. The second end of the first connector may be coupled to the first end of the first signal line 21 through at least one of the third via holes penetrating through both the passivation layer 27 and the insulating layer 24. The first end of the second connector may be coupled to the second end of the third signal line 23 through at least another one of the second via holes penetrating through the passivation layer 27. The second end of the second connector may be coupled to the second end of the fast signal line 21 through at least another one of the third via holes penetrating through both the passivation layer 27 and the insulating layer 24.

Figure 6:
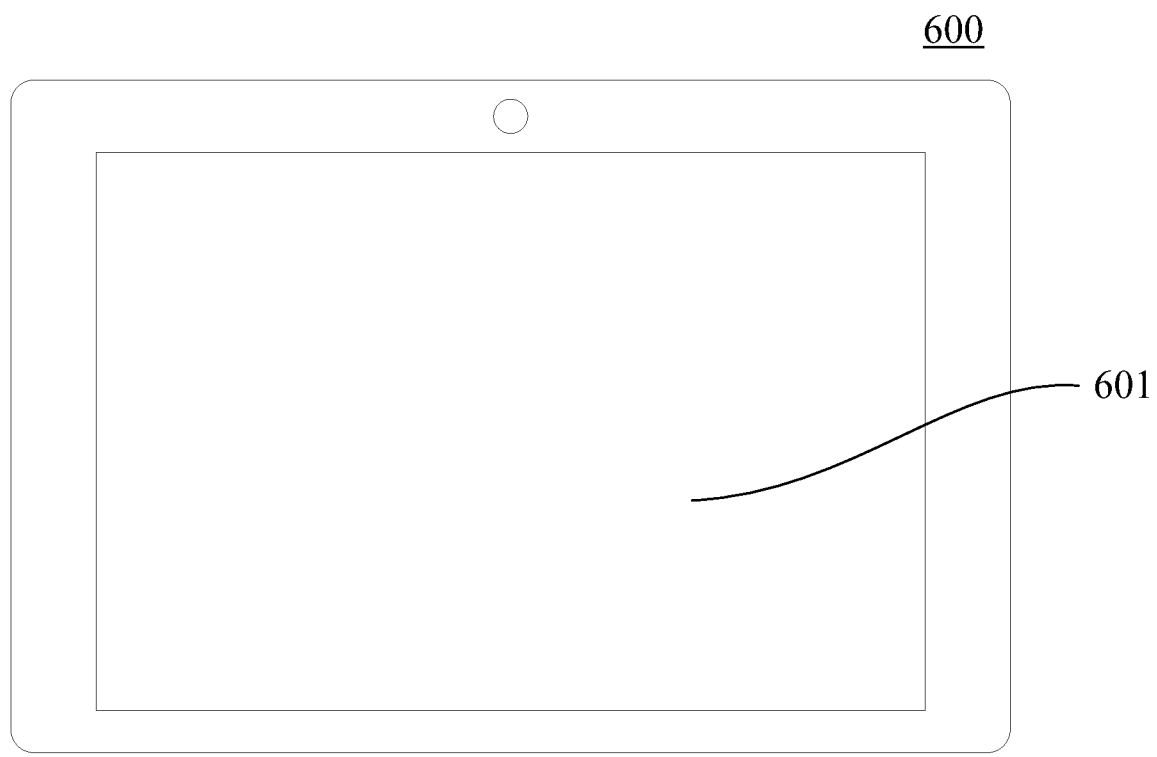
FIG. 6 illustrates a schematic view of an exemplary display device according to various disclosed embodiments of the present disclosure.

The present disclosure also provides a display device comprising the disclosed array substrate. FIG. 6 illustrates a schematic view of an exemplary display device 600 according to various disclosed embodiments of the present disclosure. As shown in FIG. 6, the display device 600 includes an array substrate 601 consistent with the disclosure. The array substrate 601 can be, for example, any one of the above-described exemplary array substrates. In addition to the army substrate 601, the display device 600 may further include other suitable structures. For example, the display device 600 may include a display panel, which further includes the array substrate 601. The display device 600 can be, for example, a tablet computer, a mobile phone, a car monitor, or a television. Any display device including an array substrate consistent with the disclosure is within the scope of the present disclosure. Because a short circuit between the data line and the touch signal line in the array substrate is suppressed, the display defects caused by the influence of the touch control in the display phase can be reduced in the display device. Accordingly, the display performance can be improved.

The present disclosure provides an array substrate, a fabrication method for the array substrate, and a display device comprising the array substrate. Consistent with the disclosure, a groove penetrating through the insulating layer may be disposed in the insulating layer, and may correspond to the spacing region between the first signal line and the second signal line. Further, the groove may extend to the bottom surface of the layer in which the first signal line and the second signal line are located, and separate the first signal line from the second signal line. Accordingly, the first signal line and the second signal line can be electrically insulated from each other, and a short circuit between the first signal line and the second signal line can be suppressed. Thus, in an embedded touch display device, the display phase may not be influenced by the touch control, thereby reducing the display defects and improving the display performance. In addition, the conductive residue exposed in the groove may be removed by etching the conductive residue in the groove together when the third signal line is subsequently formed by etching. Accordingly, the short circuit between the first signal line and the second signal line may be prevented without an additional processing step.

The present disclosure provides an array substrate comprising: a substrate; a first signal line and a second signal line disposed over the substrate, arranged in the same layer, and separated from each other; an insulating layer covering the first signal line and the second signal line; a groove formed in the insulating layer and penetrating through the insulating layer. The groove may extend to the bottom surface of the layer in which the first signal line and the second signal line are located, separate the first signal line from the second signal line and electrically insulate the first signal line from the second signal line. The disclosed array substrate may reduce the display defects and improve the display performance.

The foregoing description of the embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to persons skilled in this art. The embodiments are chosen and described in order to explain the principles of the technology, with various modifications suitable to the particular use or implementation contemplated. It is intended that the scope of the invention be defined by the claims appended hereto and their equivalents in which all terms are meant in their broadest reasonable sense unless otherwise indicated. Therefore, the term "the disclosure", "the present disclosure" or the like does not necessarily limit the claim scope to a specific embodiment, and the reference to exemplary embodiments of the disclosure does not imply a limitation on the invention, and no such limitation is to be inferred. Moreover, the claims may refer to "first", "second" etc. followed by a noun or element. Such terms should be understood as a nomenclature and should not construed as giving the limitation on the number of the elements modified by such nomenclature unless specific number has been given. Any advantages and benefits described may or may not apply to all embodiments of the disclosure. It should be appreciated that variations may be made to the embodiments described by persons skilled in the art without departing from the scope of the present disclosure. Moreover, no element or component in the present disclosure is intended to be dedicated to the public regardless of whether the element or component is explicitly recited in the following claims.

What is claimed is:

1. An array substrate, comprising:
   a base substrate;
   a first insulating layer on the base substrate;
   a first signal line and a second signal line on a side of the first insulating layer away from the base substrate, wherein the first signal line and the second signal line are in a same inter-subpixel region between two adjacent subpixel regions, in a same layer, and separated from each other;
   a second insulating layer covering the first signal line and the second signal line;
   a groove penetrating through the second insulating layer to expose a surface of the first insulating layer, wherein the groove is between the first signal line and the second signal line.

2. The array substrate according to claim 1, further comprising:
   a third signal line on a side of the second insulating layer away from the first signal line; and
   a third insulating layer on a side of the third signal line away from the base substrate, extends through the groove to be in direct contact with the surface of the first insulating layer;
   wherein an orthogonal projection of the third signal line on the substrate at least partially overlaps with an orthogonal projection of the first signal line on the substrate; and
   the orthogonal projection of the third signal line on the substrate is non-overlapping with an orthogonal projection of the second signal line on the substrate.

3. The array substrate according to claim 2, further comprising:
   a touch electrode formed over the third signal line and coupled to the third signal line.

4. The array substrate according to claim 3, wherein the third signal line and the first signal line are coupled in parallel.

5. The array substrate according to claim 1, wherein:
   a cross-section of the groove along a plane substantially parallel to a main surface of the substrate has is a substantially elongated strip shape,
   an extending direction of the substantially elongated strip shape is substantially same as an extending direction of a spacing region between the first signal line and the second signal line and in the same inter-subpixel region between the two adjacent subpixel regions, and
   a length of the substantially elongated strip shape along the extending direction of the substantially elongated strip shape is substantially same as a length of the spacing region along the extending direction of the spacing region.

6. The array substrate according to claim 1, wherein the first signal line is arranged substantially parallel to the second signal line.

7. The array substrate according to claim 6, wherein the second signal line includes a data line.

8. A display device, comprising the array substrate according to claim 1.

9. A fabrication method for an array substrate, comprising:
providing a base substrate;
forming a first insulating layer on the base substrate;
forming a pattern including a first signal line and a second signal line on a side of the first insulating layer away from the base substrate, the first signal line and the second signal line being arranged in a same inter-subpixel region between two adjacent subpixel regions, in a same layer, and separated from each other;
forming a second insulating layer covering the first signal line and the second signal line;
forming a groove penetrating through the second insulating layer to expose a surface of the first insulating layer, wherein the groove is formed between the first signal line and the second signal line.

10. The fabrication method according to claim 9,
wherein a conductive residue exists between the first signal line and the second signal after forming the pattern including the first signal line and the second signal line on the first insulating layer, and
the fabrication method further comprising:
etching through the groove to remove the conductive residue between the first signal line and the second signal line.

11. The fabrication method according to claim 10, further comprising:
forming a conductive material layer after forming the groove,
wherein etching through the groove to remove the conductive residue includes:
patterning the conductive material layer to retain conductive material in a portion of the conductive material layer having an orthogonal projection on the base substrate at least partially overlapping with an orthogonal projection of the first signal line on the base substrate, and to etch away conductive material of other portions of the conductive material layer, until a third signal line is formed and the conductive residue in the groove is removed, an orthogonal projection of the third signal line on the base substrate at least partially overlapping with the orthogonal projection of the first signal line on the base substrate.

12. The fabrication method according to claim 11, further comprising:
forming a pattern including a touch electrode over the third signal line after patterning the conductive material layer,
wherein:
the third signal line is coupled to the touch electrode, and
the third signal line and the first signal line are coupled in parallel.

13. The fabrication method according to claim 9, wherein:
forming the groove includes forming a groove having a cross-section along a plane substantially parallel to a main surface of the substrate having a substantially elongated strip shape,
an extending direction of the substantially elongated strip shape is substantially same as an extending direction of a spacing region between the first signal line and the second signal line and in the same inter-subpixel region between the two adjacent subpixel regions, and
a length of the substantially elongated strip shape along the extending direction of the substantially elongated strip shape is substantially same as a length of the spacing region along the extending direction of the spacing region.

14. The fabrication method according to claim 9, wherein the first signal line is formed to be parallel to the second signal line.

15. The fabrication method according to claim 14, wherein the second signal line includes a data line.

16. The fabrication method according to claim 9, further comprising:
forming a third signal line on a side of the second insulating layer away from the first signal line; and
forming a third insulating layer on a side of the third signal line away from the base substrate, the third insulating layer formed to extend through the groove to be in direct contact with the surface of the first insulating layer;
wherein an orthogonal projection of the third signal line on the substrate at least partially overlaps with an orthogonal projection of the first signal line on the substrate; and
the orthogonal projection of the third signal line on the substrate is non-overlapping with an orthogonal projection of the second signal line on the substrate.

* * * * *